US009030901B2

(12) United States Patent
Heo

(10) Patent No.: US 9,030,901 B2
(45) Date of Patent: May 12, 2015

(54) SEMICONDUCTOR MEMORY DEVICE

(71) Applicant: SK Hynix Inc., Gyeonggi-do (KR)

(72) Inventor: Hyun Heo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 231 days.

(21) Appl. No.: 13/716,047

(22) Filed: Dec. 14, 2012

(65) Prior Publication Data

US 2014/0064001 A1  Mar. 6, 2014

(30) Foreign Application Priority Data

Aug. 29, 2012 (KR) .................. 10-2012-0095051

(51) Int. Cl.
*G11C 7/00* (2006.01)
*G11C 7/12* (2006.01)
*G11C 8/00* (2006.01)
*G11C 8/12* (2006.01)
*G11C 16/12* (2006.01)

(52) U.S. Cl.
CPC .. *G11C 7/12* (2013.01); *G11C 8/00* (2013.01); *G11C 8/12* (2013.01); *G11C 16/12* (2013.01)

(58) Field of Classification Search
USPC ................................ 365/203, 230.03, 185.13
See application file for complete search history.

(56) References Cited

U.S. PATENT DOCUMENTS

| 6,643,210 | B2 * | 11/2003 | Yamano | 365/230.03 |
| 6,788,611 | B2 * | 9/2004 | Hsu et al. | 365/230.05 |
| 7,355,876 | B2 * | 4/2008 | Murata | 365/63 |
| 7,379,362 | B2 * | 5/2008 | Abe et al. | 365/203 |
| 7,733,681 | B2 * | 6/2010 | Miyamoto | 365/65 |
| 8,077,494 | B2 * | 12/2011 | Miyamoto | 365/145 |
| 8,649,220 | B2 * | 2/2014 | Matsui | 365/185.18 |

FOREIGN PATENT DOCUMENTS

| KP | 1019980056445 | 9/1998 |
| KR | 1020090074431 | 7/2009 |

* cited by examiner

*Primary Examiner* — Pho M Luu
(74) *Attorney, Agent, or Firm* — IP & T Group LLP

(57) ABSTRACT

A semiconductor memory device includes a first memory block group including memory blocks coupled to first sub bit lines, a second memory block group including memory blocks coupled to second sub bit lines, an operation circuit coupled to main bit lines, and configured to perform an operation for data input/output to/from a memory block selected from the first memory block group or the second memory block group, and a bit line control circuit configured to differently control sub bit lines of the selected memory block group and sub bit lines of the unselected memory block groups in response to group select signals for selecting a memory block group including the selected memory block of the first memory block group and the second memory block group and voltages of the main bit lines controlled by the operation circuit.

21 Claims, 7 Drawing Sheets

SEMICONDUCTOR MEMORY DEVICE

CROSS-REFERENCE TO RELATED APPLICATION

This application claims priority from Korean Patent Application No. 10-2012-0095051 filed on. Aug. 29, 2012, the contents of which are incorporated herein by reference in its entirety.

BACKGROUND OF THE INVENTION

Exemplary embodiments of the present invention relate to a semiconductor design technology, and more particularly, to a semiconductor memory device including a bit line.

A semiconductor memory device includes a memory array. Memory cells included in the memory array may be divided into memory blocks. To perform an operation related to data input/output to/from the memory cells, operation voltages needed for the data input/output operation should be supplied to a selected memory block.

To supply the operation voltages to the selected memory block of the memory blocks, a row decoder for generating block select signals according to a row address signal and voltage transferring circuits for transferring the operation voltages to the selected memory block according to block select signals are required.

Since the memory array includes a plurality of memory blocks, the block select signals corresponding to number of the memory blocks should be generated to select one of the memory blocks. Accordingly, a circuit for embody the row decoder has become complex, and an area occupied by the row decoder in a chip has increased.

High voltage may be required for the data input/output to/from the memory cells. Accordingly, the voltage transferring circuits should have high voltage transistors being capable to operate at high voltage. Size of the high voltage transistors is greatly larger than that of normal transistors. Since each of the memory blocks is provided with the voltage transferring circuit, an area by which the voltage transferring circuits occupy is considerably burdensome.

As a result, an area by which a peripheral circuit occupies increases accordingly as the number of the memory block increases, and thus size of the chip also increases.

SUMMARY OF THE INVENTION

Exemplary embodiments of the present invention provide a semiconductor memory device to prevent increase of an area by which a peripheral circuit occupies.

A semiconductor memory device according to an embodiment of the present invention includes a first memory block group including memory blocks coupled to first sub bit lines a second memory block group including memory blocks coupled to second sub bit lines, an operation circuit coupled to main bit lines, and configured to perform an operation for data input/output to/from a memory block selected from the first memory block group or the second memory block group, and a bit line control circuit configured to differently control sub bit lines of the selected memory block group and sub bit lines of the unselected memory block groups in response to group select signals for selecting a memory block group including the selected memory block of the first memory block group and the second memory block group and voltages of the main bit lines controlled by the operation circuit.

In the embodiment of the present invention, an area occupied by a peripheral circuit may be prevented from increasing.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that ill fall within the spirit and scope of the principles of this disclosure. In this specification, 'connected/coupled' represents that one component is directly coupled to another component or indirectly coupled through another component. In this specification, a singular form may include a plural form as long as it is not specifically mentioned in a sentence.

Figure 1:
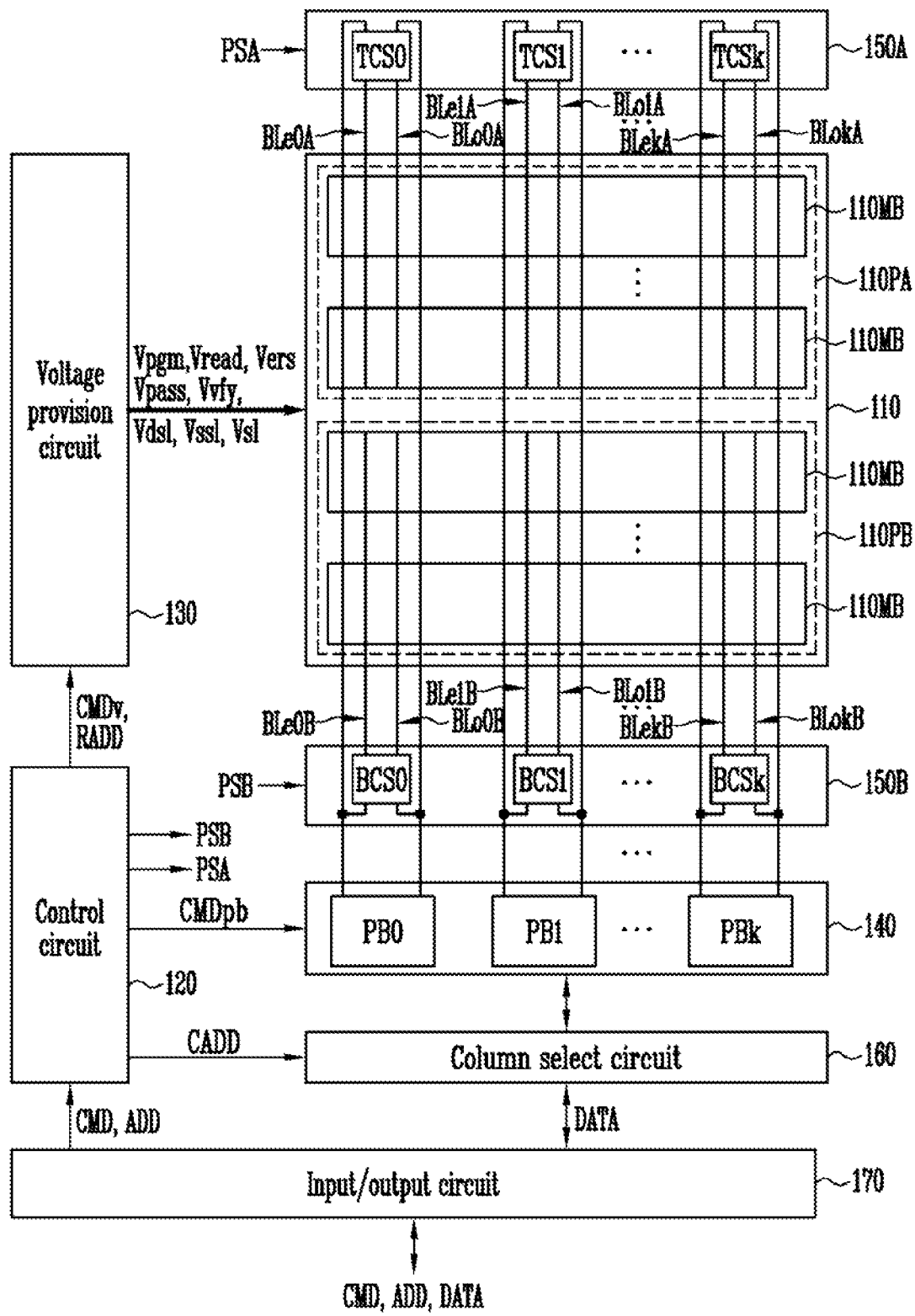
FIG. 1 is a block diagram illustrating a semiconductor memory device according to an embodiment of the present invention.

FIG. 1 is a block diagram illustrating a semiconductor memory device according to an embodiment of the present invention.

In FIG. 1, the semiconductor memory device includes a memory array 110 and a peripheral circuit 120 to 170. The peripheral circuit includes operation circuits 120, 130, 140, 160, and 170 and a bit line control circuit 150. In a flash memory device, the operation circuit may include a control circuit 120, a voltage provision circuit 130, a page buffer group 140, a column select circuit 160, and an input/output circuit 170.

The memory array 110 includes memory block groups 110PA and 110PB. The memory block groups 110PA and 110PB have memory blocks 110MB. The memory blocks 110MB in the first memory block group 110PA are coupled to first sub bit lines BLe0A to BLekA, and the memory block 110MB in the second memory block group 110PB are coupled to second sub bit lines BLo0B to BLokB. Here, the first memory block group 110PA may be a first plane, and the second memory block group 110PB may be a second plane.

Hereinafter, the memory block 110MB included in the memory block groups 110PA and 110PB will be described in detail.

Figure 2:
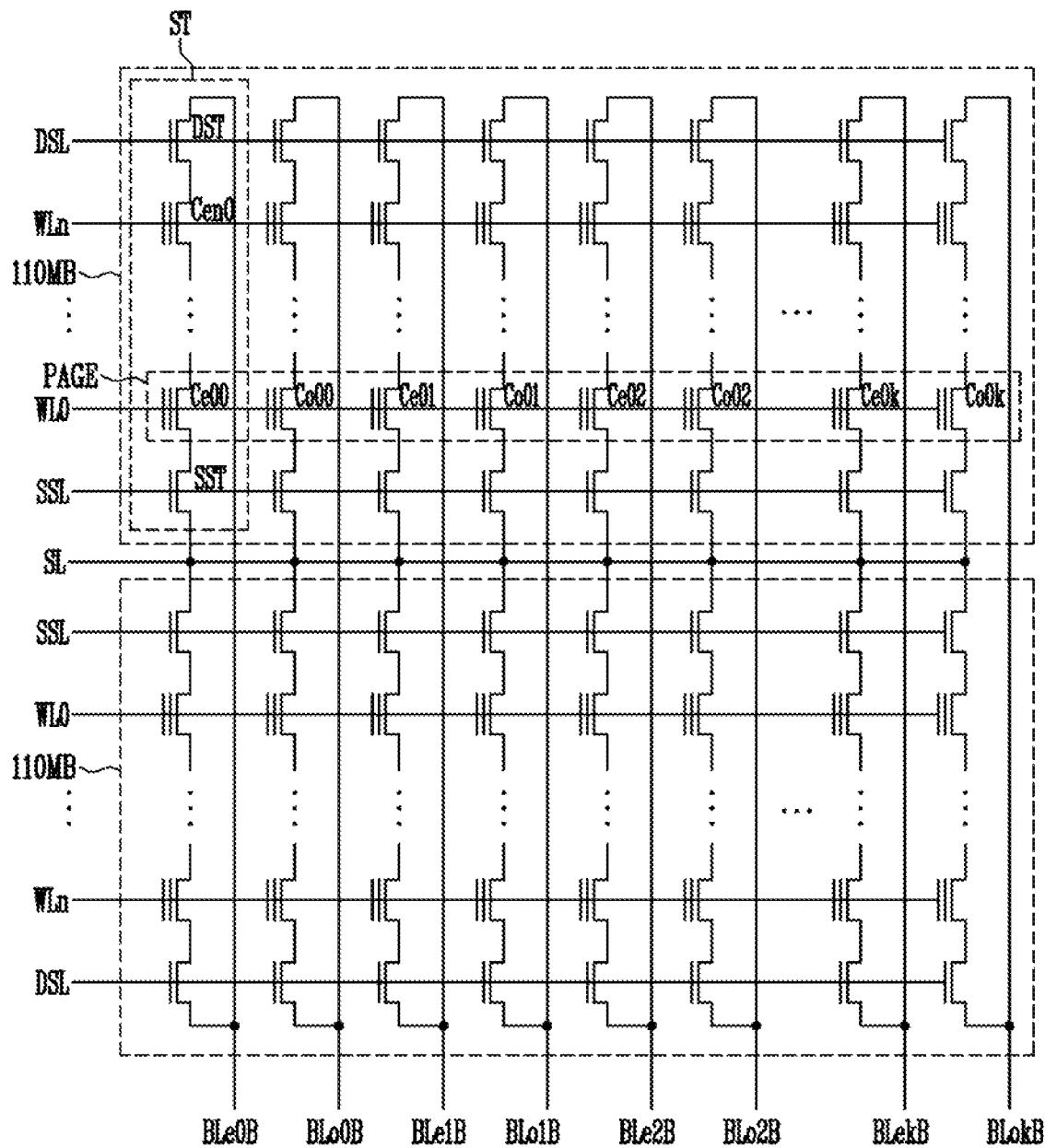
FIG. 2 is a detailed diagram illustrating a memory block shown in FIG. 1.

FIG. 2 is a detailed diagram illustrating a memory block shown in FIG. 1. An operation of the memory block will be described in detail through the memory block 110MB included in the second memory block group 110PA.

In FIG. 2, each of the memory blocks includes memory strings ST coupled between bit lines BLe0B to BLekB and BLo0B to BLokB and a common source line SL. That is, the memory strings ST are coupled to corresponding bit lines BLekB to BLekB and BLo0B to BLokB, and they are coupled to the common source line SL. Here, described bit lines BLekB to BLekB and BLo0B to BLokB are second sub bit lines BLe0B to BLekB and BLo0B to BLokB.

Each of the memory strings ST includes a source select transistor SST, a cell string where memory cells Ce00 to Cen0 are coupled in series, and a drain select transistor DST. Sources of the source select transistor SST are coupled to the common source line SL, and drains of the drain select transistors DST are coupled to the bit lines. The memory cells Ce00 to Cen0 included in the cell string are coupled in series between the select transistors SST and DST. A gate of the source select transistor SST is coupled to the source select line SSL, each of gates of the memory cells Ce00 to Cen0 is coupled to corresponding word line WL0 to WLn, and a gate of the drain select transistor DST is coupled to the drain select line DSL.

Here, the drain select transistor DST controls electrical connection or electrical blocking between the cell string Ce00 to Cen0 and the bit line, and the source select transistor SST controls electrical connection or electrical blocking between the cell string Ce00 to Cen0 and the common source line SL.

The memory cells included in the memory cell block in a NAND flash memory device may be divided into physical page or logical page. For example, the memory cells Ce00 to Ce0k and Co00 to Co0k coupled to one word line, e.g. WL0 form one physical page PAGE. Additionally, even memory cells Ce00 to Ce0k coupled to one word line, e.g. WL0 may form one even physical page, and odd memory cells Co00 to Co0k may form one odd physical page. The page (or even page and odd page) is basic unit of a program operation or a read operation.

Now referring to FIGS. 1 and 2, the peripheral circuit 120 to 170 performs an erase loop, a program loop and a read operation of the memory cells Ce00 to Ce0k or Co00 to Co0k coupled to a selected word line, e.g. WL0. The peripheral circuit 120 to 170 includes the operation circuit 120, 130, 140, 160, and 170 and the bit line control circuit 150A and 150B.

The operation circuit 120, 130, 140, 160, and 170 includes the control circuit 120 for controlling the program loop, the read loop and the erase operation and circuits 130, 140, 160, and 170 for performing the program loop, the read loop and the erase operation based on control of the control circuit 120. To perform the program loop, the read loop and the erase operation, the operation circuit 120, 130, 140, 160, and 170 selectively outputs operation voltages Verase, Vgpm, Vread, Vpass, Vvfy, Vdsl, Vssl, Vsl to local lines SSL, WL0 to WLn, DSL and the common source line SL of the selected memory block, controls precharge/discharge of main bit lines BLe0 to BLek or BLo0 to Blok, or senses voltage or current of the main bit lines BLe0 to BLek or BLo0 to Blok.

The bit line control circuit 150A and 150B differently control sub bit lines of the selected memory block group and sub bit lines not selected based on group select signals PSA and PSB, for selecting the memory block group including the selected memory block of the first and the second memory block groups 110PA and 110PB, and voltages of the main bit lines BLe0B to BLekB and BLo0B to BLokB controlled by the operation circuit 120, 130, 140, 160, and 170.

In the NAND flash memory device, the operation circuit includes the control circuit 120, the voltage provision circuit 130, the page buffer group 140, the column select circuit 160 and the input/output circuit 170. The above elements will be described in detail.

The control circuit 120 outputs a voltage control signal CMDv for controlling the voltage provision circuit 130 to generate the operation voltages Verase, Vgpm, Vread, Vpass, Vvfy, Vdsl, Vssl and Vsl for performing the program loop, the read operation or the erase loop, with desired level in response to a command signal CMD inputted from an external device through the input/output circuit 170. The control circuit 120 outputs PB control signals CMDpb for controlling page buffers PB0 to PBk included in the page buffer group 140 to perform the program loop, the read loop or an erase loop. The program loop includes a program operation and a program verifying operation, and it may be performed through an increment step pulse program ISPP. The erase loop includes an erase operation and an erase verifying operation, and it may be performed through an increment step pulse erase ISPE. The control circuit 120 generates a column address signal CADD and a row address signal RADD based on inputted address signal ADD, and outputs the generated address signals CADD and RADD.

Hereinafter, the voltage provision signal 130 will be described in detail.

Figure 3:
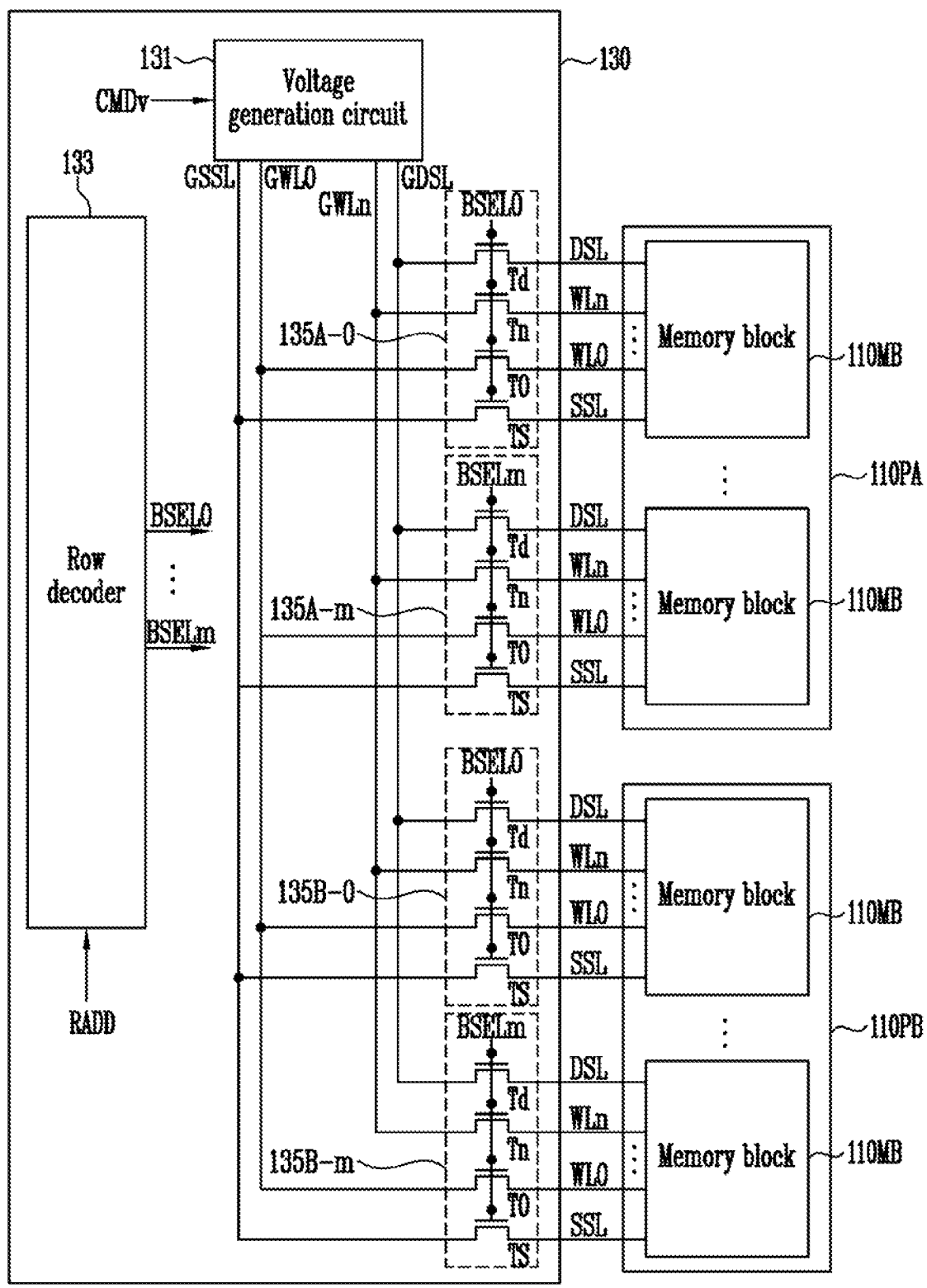
FIG. 3 is a detailed diagram illustrating a voltage providing circuit shown in FIG. 1.

FIG. 3 is a detailed diagram illustrating a voltage provision circuit shown in FIG. 1.

In FIG. 3, the voltage provision circuit 130 generates operation voltages needed for the program loop, the read operation or the erase loop of the memory cells in response to the voltage control signal CMDv of the control circuit 120, and outputs the operation voltages to local lines SSL, WL0 to WLn, DSL and the common source line SL of the selected memory block in response to the row address signal RADD of the control circuit 120.

The voltage provision circuit 130 may include a voltage generation circuit 131, a row decoder 133 and a voltage transferring circuit 135A-0 to 135A-m and 135B-0 to 135B-m.

The voltage generation circuit 131 outputs the operation voltages to global lines GSSL, GWL0 to GWLn, and GDSL in response to the voltage control signal CMDv of the control circuit 120. Specifically, the voltage generation circuit 131 may supply a program voltage to a selected global word line and provide pass voltages to global word lines not selected when the program operation is performed. Furthermore, the voltage generation circuit 131 may supply a program verifying voltage to the selected global word line and provide pass voltages to the global word lines not selected when the program verifying operation is performed. The voltage generation circuit 131 may supply a read voltage to the selected global line and provide a pass voltage to the global word lines not selected when the read operation is performed. The voltage generation circuit 131 may supply an erase allowable voltage, e.g. 0V, to the global lines when the erase operation is performed. In addition, the voltage generation circuit 131 may provide an erase verifying voltage to the global lines when the erase verifying operation is performed. The voltage generation circuit 131 may differently adjust timing of voltage supplied to the global lines GSSL, GWL0 to GWLn, and GDSL to enhance operation characteristics, and provide the operation voltage with changing level of the operation voltage to level selected from various levels. Outputting and changing of the operation voltages Verase, Vgpm, Vread, Vpass, Vvfy, Vdsl, Vssl, and Vsl are performed by the voltage generation circuit 131 based on a control signal V_CONTROLs of the control circuit 120.

The row decoder 133 outputs block select signals BSEL[0:m] for selecting one of the memory blocks in response to the row address signal RADD of the control circuit 120. Specifically, the row decoder 133 outputs the block select signals BSEL[0:m] by decoding only a block address signal included in the rove address signal RADD. That is, the row decoder 133 decodes only the row address signal except an address signal, e.g. plane address signal for separating the first memory block group and the second memory block group. As a result, the number of the semiconductor device, e.g. transistor or logic gate included in the row decoder 133 reduces, and thus, an area occupied by the row decoder 133 may be reduced.

The voltage transferring circuit includes voltage transferring sections 135A-0 to 15A-m and 135B-0 to 135B-m. Each of the memory blocks includes the voltage transferring section 135A-0 to 135A-m and 135B-0 to 135B-m. Each of the voltage transferring section 135A-0 to 135A-m and 135B-0 to 135B-m transfers the operation voltages outputted from the voltage generation circuit 131 to the local lines SSL, WL0 to WLn, and DSL of the selected memory block in response to the block select signals BSEL[0:m] outputted from the row decoder 133. That is each of the voltage transferring section 135A-0 to 135A-m and 135B-0 to 135B-m connects electrically the global word lines GSSL, GWL0 to WLn, and GDSL to the local lines SSL, WL0 to WLn, and DSL of the selected memory block in response to the block select signals BSEL[0:m] outputted from the row decoder 133.

The block select signals BSEL[0:m] are transmitted in common to first voltage transferring sections 35A-0 to 135A-m corresponding to the memory blocks 110MB of the first memory block group 110PA and second voltage transferring sections 135B-0 to 135B-m corresponding to the memory block 110MB of the second memory block group 110PB. Accordingly, one of the first voltage transferring sections 135A-0 to 135A-m coupled to the memory blocks 110MB of the first memory block group 110PA and one of the second voltage transferring sections 135B-0 to 135B-m coupled to the memory blocks 110MB of the second block group 110PB are enabled simultaneously based on the block select signals BSEL[0:m]. As a result, the local lines SSL, WL0 to WLn, and DSL of the memory block 110MB selected from the first memory block group 110PA and the local lines SSL, WL0 to WLn, and DSL of the memory block 110MB selected from the second memory block group 110PB may be coupled simultaneously to the global word lines GSSL, GWL0 to WLn, and GDSL. In other words, the memory block 110MB of the first memory block group 110PA and the memory block 110MB of the second memory block group 110PB corresponding to the block address signals are selected simultaneously.

Now referring to FIG. 1, each of the page buffer group 140 includes page buffers PB0 to PBk coupled to the main bit lines BLe0 to BLek and BLo0 to Blok. The page buffers PB0 to PBk control voltages of the main bit lines BLe0 to BLek and BLo0 to Blok based on the PB control signal CMDpb of the control circuit 120 and data to be stored in the memory cells when the program operation is performed.

For example, the page buffers PB0 to PBk discharge selectively the main bit lines BLe0 to BLek and BLo0 to BLok based on the PB control signal CMDpb of the control circuit 120 and the data to be stored in the memory cells when the program operation is performed. Specifically, the page buffers PB0 to PBk may differently control voltages of even main bit lines BLe0 to BLek and voltages of odd main bit lines BLo0 to BLok of the main bit lines BLe0 to BLek and BLo0 to BLok when the program operation is performed. Particularly, for example, the page buffers PB0 to PBk may discharge even main bit lines selected from the even main bit lines BLe0 to BLek and precharge even main bit lines not selected according to data to be stored in even memory cells when a program operation for the even memory cells is performed. Here, the odd main bit lines BLo0 to BLok are precharged by the page buffers PB0 to PBk. Additionally, the page buffers PB0 to PBk latch data read from the memory cell by sensing change of voltage or current of the bit lines BLe0 to BLek or BLo0 to BLok after precharging the main bit lines BLe0 to BLek or BLo0 to BLok when the program verifying operation or the read operation is performed.

Since the main bit lines BLe0B to BLekB and BLo0B to BLokB are divided into the even main bit lines BLe0B to BLekB and the odd main bit lines BLo0B to BLokB, each of pairs of main bit lines including the even main bit line and the odd main bit line may be coupled to corresponding page buffer. However, every main bit line BLe0B to BLekB and BLo0B to BLokB, without separation of the even main bit line and the odd main bit line, may be coupled to corresponding page buffer.

The column select circuit 160 selects the page buffers PB0 to PBk included in the page buffer group 150 in response to the column address CADD outputted from the control circuit 120. That is, the column select circuit 160 delivers in sequence data to be stored in the memory cells to the page buffers PB0 to PBk in response to the column address CADD. Furthermore, the column select circuit 160 selects in sequence the page buffers PB0 to PBk in response to the column address CADD so that the data of the memory cells latched in the page buffers PB0 to PBk is outputted to an outside device in the read operation.

The input/output circuit 170 delivers the command signal CMD and the address signal ADD inputted from an external device to the control circuit 120. In addition, the input/output circuit 170 delivers the data DATA inputted from the external device to the column select circuit 160 in the program operation, or outputs the data read from the memory cells to an external device in the read operation.

Hereinafter the bit line control circuit 150A and 150B will be described in detail.

Figure 4:
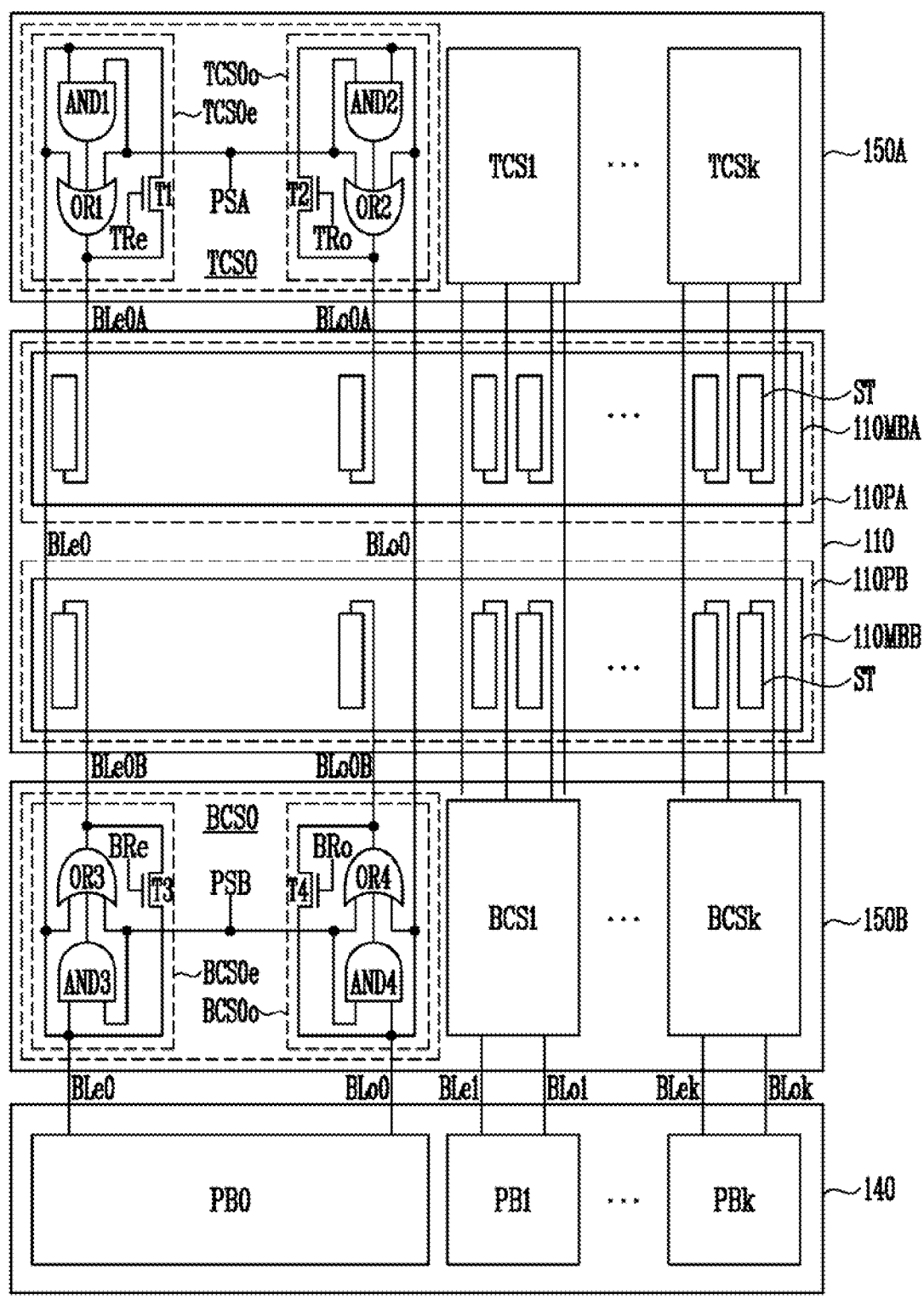
FIG. 4 is a detailed diagram illustrating a bit line control circuit shown in FIG. 1.
Figure 5:
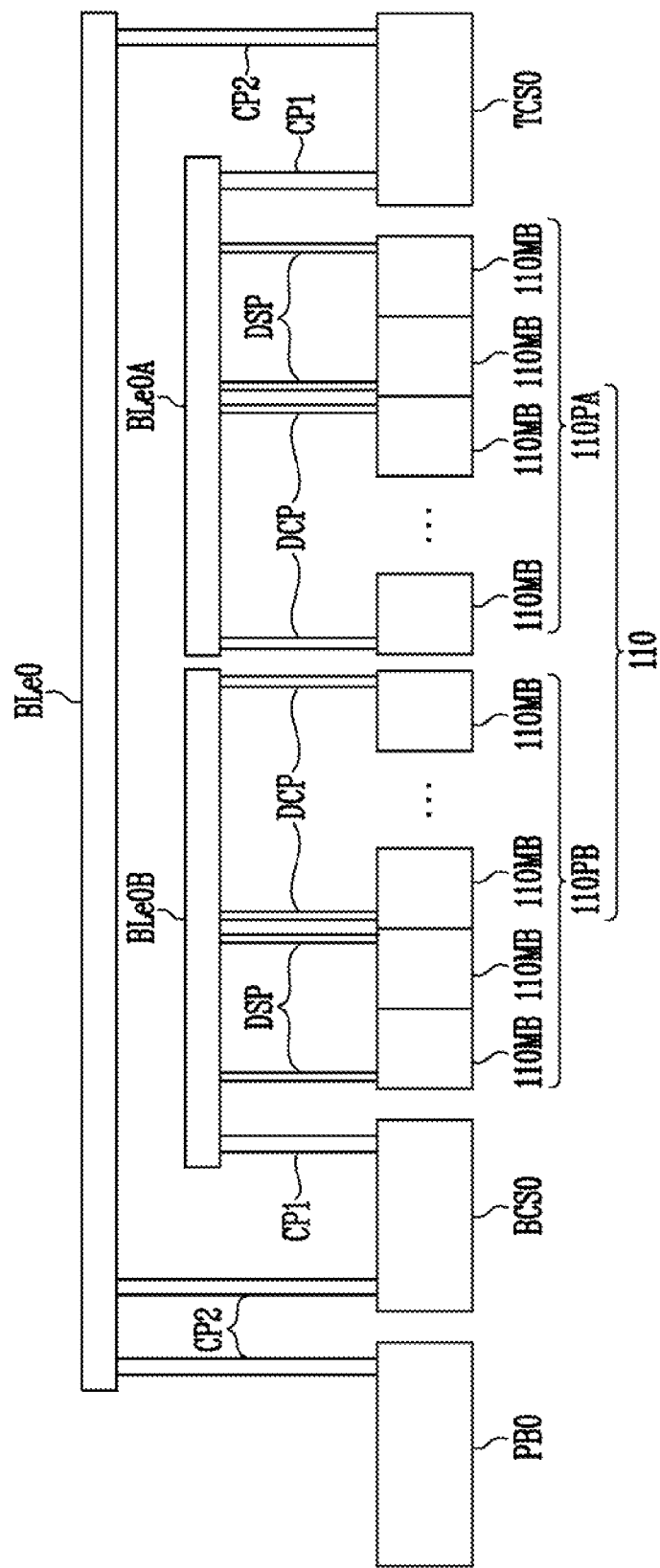
FIG. 5 is a detailed diagram illustrating a connection of the bit line control circuit shown in FIG. 1.

FIG. 4 is a detailed diagram illustrating a bit line control circuit shown in FIG. 1. FIG. 5 is a detailed diagram illustrating a connection of the bit line control circuit shown in FIG. 1.

In FIG. 4, the bit line control circuit 150A and 150B includes a first bit line control circuit 150A and a second bit line control circuit 150B. The first bit line control circuit 150A controls the first sub bit lines BLe0A to BLekA and BLo0A to BLokA in response to the voltages of the main bit lines BLe0 to BLek and BLo0 to BLok and a first group select signal PSA. The second bit line control circuit 150B controls second sub bit lines BLe0B to BLekB and BLo0B to BLokB in response to the voltages of the main bit lines BLe0 to BLek and BLo0 to BLok and a second group select signal PSB.

The first bit line control circuit 150A includes sub bit line control circuits TCS0 to TCSk coupled to each of pairs of the sub bit lines, e.g. BLe0A and BLo0A. Each of the sub bit line control circuits may include an even sub bit line control circuit TCS0e and an odd sub bit line control circuit TCS0o. The first bit line control circuit 150A includes an AND gate, e.g. AND1, an OR gate and a switching element, e.g. T1, coupled between the main bit line, e.g. BLe0, and the first sub bit line, e.g. BLe0A, and operating in response to a sensing enable signal, e.g. TRe. Here, voltage of the main bit line, e.g. BLe0, and the first group select signal PSA are inputted to the AND gate, the voltage of the main bit line, e.g. BLe0, of the main bit line, the first group select signal PSA and an output signal of the AND gate, e.g. AND1, are inputted to the OR gate, and an output terminal of the OR gate is coupled to the first sub bit line, e.g. BLe0A.

The second bit line control circuit 150B includes sub bit line control circuits BCS0 to BCSk coupled to each of pairs of the sub bit lines, e.g. BLe0B, BLo0B. Each of the sub bit line control circuits may include an even sub bit line control circuit BCS0e and an odd sub bit line control circuit BCS0o. The second bit line control circuit 150B includes an AND gate, e.g. AND3, an OR gate and a switching element, e.g. T3, coupled between the main bit line, e.g. BLe0, and the second sub bit line, e.g. BLe0B, and operating in response to a sensing enable signal, e.g. BRe. Here, the voltage of the main bit line, e.g. BLe0, and the second group select signal PSB are inputted to the AND gate, the voltage of the main bit line, e.g. BLe0, of the main bit line, the second group select signal PSB and an output signal of the AND gate, e.g. AND3, are inputted to the OR gate, and an output terminal of the OR gate is coupled to the second sub bit line, e.g. BLe0B.

In case that the main bit lines BLe0 to BLek and BLo0 to BLok are divided into the even main bit lines BLe0 to BLek and the odd main bit lines BLo0 to BLok, the first and second bit line control circuits 150A and 150B are described as follows.

The first bit line control circuit 150A includes a first AND gate AND1, a first OR gate OR1, a first switching element T1 coupled between the even main bit line BLe0 and the first even sub bit line BLe0A and operating in response to a first even sensing enable signal TRe, a second AND gate AND2, a second OR gate OR2 and a second switching element T2 coupled between the odd main bit line BLo0 and the first odd sub bit line BLo0A and operating in response to a first odd sensing enable signal TRo. Here, voltage of the even main bit line BLe0 of the main bit lines BLe0 to BLek and BLo0 to BLok and the first group select signal PSA are inputted to the first AND gate AND1, the voltage of the even main bit line BLe0, the first group select signal PSA and an output signal of the first AND gate AND1 are inputted to the first OR gate OR1, and an output terminal of the first OR gate OR1 is coupled to the first even sub bit line BLe0A of the first sub bit lines BLe0A to BLekA and BLo0A to BLokA. Voltage of the odd main bit line BLo0 of the main bit lines BLe0 to BLek and BLo0 to BLok and the first group select signal PSA are inputted to the second AND gate AND2, the voltage of the odd main bit line BLo0, the first group select signal PSA and an output signal of the second AND gate AND2 are inputted to the second OR gate OR2, and an output terminal of the second OR gate OR2 is coupled to the first odd sub bit line BLo0A of the first sub bit lines BLe0A to BLekA and BLo0A to BLokA.

The second bit line control circuit 150B includes a third AND gate AND3, a third OR gate OR3, a third switching element. T3 coupled between the even main bit line BLe0 and the second even sub bit line BLe0B and operating in response to a second even sensing enable signal BRe, a fourth AND gate AND4, a fourth OR gate OR4, and a fourth switching element T4 coupled between the odd main bit line BLo0 and the second odd sub bit line BLo0B and operating in response to a second odd sensing enable signal BRo. Here, voltage of the even main bit line BLe0 of the main bit lines BLe0 to BLek and BLo0 to BLok and the second group select signal PSB are inputted to the third AND gate AND3, the voltage of the even main bit line BLe0, the second group select signal PSB and an output signal of the third AND gate AND3 are inputted to the third OR gate OR3, and an output terminal of the third OR gate OR3 is coupled to the second even sub bit line BLe0B of the second sub bit lines BLe0B to BLekB and BLo0B to BLokB. Voltage of the odd main bit line BLo0 of the main bit lines BLe0 to BLek and BLo0 to BLok and the second group select signal PSB are inputted to the fourth AND gate AND4, the voltage of the odd main bit line BLo0, the second group select signal PSB, and an output signal of the fourth AND gate AND4 are inputted to the fourth OR gate OR4, and an output terminal of the fourth OR gate OR4 is coupled to the second odd sub bit line BLo0B of the second sub bit lines BLe0B to BLekB and BLo0B to BLokB.

Referring to FIG. 5, each of the main bit line BLe0 may be disposed on different layer from the first sub bit line BLe0A and the second sub bit line BLe0B. The first sub bit line BLe0A and the second sub bit line BLe0B may be coupled to the memory blocks 110MB through drain contact plugs DCP. Additionally, the first sub bit line BLe0A and the second sub bit line BLe0B may be coupled to the bit line control circuit TCS0 and BCS0 through contact plugs CP1. The main bit line BLe0 may be coupled to the bit line control circuit TCS0 and BCS0 or the page buffer PB0 through contact plugs CP2.

Hereinafter, an operation of the first and second bit control circuits 150A and 150B including the above elements will be described in detail.

The first and second bit line control circuits 150A and 150B differently control sub bit lines of the selected memory block group and sub bit lines not selected based on the group select signals PSA and PSB for selecting the memory block group including the selected memory block of the memory block groups 110PA and 110PB and voltages of the main bit lines BLe1 to BLek and BLo1 to BLok controlled by the operation circuit 120, 130, 140, 160, and 170, especially page buffers. Here, the operation circuit, especially the control circuit may output the group select signals PSA and PSB by decoding the address signal, group address signal or plane address signal. That is, the group select signals PSA and PSB may be generated from the operation circuit through decoding the address signal. An operation of the first and second bit line control circuits 150A and 150B are described as follows and will be described with respect to a program operation, a read operation, and an erase operation.

Program Operation

TABLE 1

|  | BLe0 | BLo0 | PSA | PSB | 110PA well | 110PB well |
|---|---|---|---|---|---|---|
| 110PA program | 0 V | Vcc | 0 V | Vcc | 0 V | 0 V |
| 110PB program | 0 V | Vcc | Vcc | 0 V | 0 V | 0 V |

Operation described below is performed according to voltage condition in Table 1. A program operation of a memory block selected from the first memory block group 110PA will be described as an example.

In the program operation for storing data in memory cells included in the memory block selected from the first memory block group 110PA, the first and second bit line control circuits 150A and 150B selectively discharge the first sub bit lines BLe0A to BLekA of the first memory block group 110PA and precharge the second sub bit lines BLo0B to BLokB of the second memory block group 110PB based on the voltages of the main bit lines BLe1 to BLek and BLo1 to BLok and the group select signals PSA and PSB.

The operation circuit, especially page buffers, controls voltages of the even main bit lines BLe0 to BLek and voltages of the odd main bit lines BLo0 to BLok of the main bit lines BLe1 to BLek and BLo1 to BLok according to data to be stored in the memory cells. Accordingly, the first bit line control circuit 150A may discharge selectively the first even sub bit lines BLe0A to BLekA of the first sub bit lines BLe0A to BLekA and BLo0A to BLokA and precharge the first odd sub bit lines BLo0A to BLokA in response to the voltages of the even main bit lines BLe0 to BLek and the group select signals PSA and PSB. Furthermore, the first bit line control circuit 150A may discharge selectively the first odd sub bit lines BLo0A to BLokA and precharge the first even sub bit lines BLe0A to BLekA based on voltages of the odd main bit lines BLo0 to BLok and the group select signals PSA to PSB.

The second bit line control circuit 150B precharges all of the second even sub bit lines BLe0B to BLekB and the second odd sub bit lines BLo0B to BLokB included in the second sub bit lines BLe0B to BLekB and BLo0B to BLokB based on the group select signals PSA and PSB.

The memory cells of the first even sub bit lines set to have discharge state according to the data stored in the memory cells of the first even sub bit lines BLe0A to BLekA by the first and second bit line control circuits 150A and 150B are programmed, and memory cells of the first even sub bit lines and the first odd sub bit lines set to have precharge state are not programmed. In addition, since every second sub bit line BLo0B to BLokB is precharged by the first and second bit line control circuits 150A and 150B, memory cells are not programmed though a program voltage is supplied to the memory block 110MB selected from the second memory block group 110PB.

Read Operation (and Program Verifying Operation)

TABLE 2

|  | BLe0 | BLo0 | PSA | PSB | 110PA well | 110PB well |
|---|---|---|---|---|---|---|
| 110PA read(verifying) | Vpre | 0 V | Vpre | 0 V | 0 V | 0 V |
| 110PB read(verifying) | Vpre | 0 V | 0 V | Vpre | 0 V | 0 V |

Operation described below is performed according to voltage condition in Table 2. A read operation of a memory block selected from the first memory block group 110PA will be described as an example. Level of a voltage supplied to the memory cell in the read operation is different from that of a voltage provided to the memory cell in the program verifying operation, but the first and second bit line control circuits 150A and 150B may operate identically in the read operation and the program verifying operation. Accordingly, only the read operation will be described.

In the read operation (or program verifying operation for verifying result of the program operation) of the memory cells included in the memory block 110MB selected from the first memory block group 110PA, the first and second bit line control circuits 150A and 150B precharge the first sub bit lines BLe0A to BLekA and BLo0A to BLokA of the first memory block group 110PA and precharge or discharge selectively the second sub bit lines BLe0B to BLekB and BLo0B to BLokB of the second memory block group 110PB based on voltages of the main bit lines BLe0 to BLek and BLo0 to BLok and the group select signals PSA and PSB. That is, the first and second bit line control circuits 150A and 150B may precharge all of the even sub bit lines BLe0A to BLekA and the odd sub bit lines BLo0A to BLokA included in the first sub bit lines BLe0A to BLekA and BLo0A to BLokA. The first and second bit line control circuits 150A and 150B may precharge the even sub bit lines BLe0B to BLekB included in the second sub bit lines BLe0B to BLekB and BLo0B to BLokB and discharge the odd sub bit lines BLo0B to BLokB, or discharge the even sub bit lines BLe0B to BLekB and precharge the odd sub bit lines BLo0B to BLokB.

Since the second sub bit lines BLe0B to BLekB and BLo0B to BLokB of the second memory block group 110PB are not coupled to the main bit lines BLe0 to BLek and BLo0 to BLok by the second bit line control circuit 150B, their states do not matter. Additionally, although the first odd sub bit lines BLo0A to BLokA of the first sub bit lines BLe0A to BLekA and BLo0A to BLokA of the first memory block group 110PA are precharged, the first odd sub bit lines BLo0A to BLokA do not matter because the page buffers PB0 to PBk sense only voltage or current of the even main bit lines BLe0 to BLek.

The first and second bit line control circuits 150A and 150B connect the first sub bit lines BLe0A to BLekA and BLo0A to BLokA to the main bit lines BLe0 to BLek and BLo0 to BLok in response to the sensing enable signal TRe, TRo so that the operation circuit, especially page buffers, senses voltage or current of the first sub bit lines BLe0A to BLekA and BLo0A to BLokA after a read voltage (or a verifying voltage) is supplied to the memory cells included in the memory block 110MB selected from the first memory block group 110PA by the operation circuit, especially voltage provision circuit. The page buffers PB0 to PBk latch data stored in the memory cells by sensing the voltage or the current of the first sub bit lines BLe0A to BLekA and BLo0A to BLokA and the main bit lines BLe0 to BLek and BLo0 to BLok.

Erase Operation

The erase operation supplies an erase allowable voltage, e.g. 0V to the local lines SSL, WL0WLn, and DSL of the selected memory block irrespective of the voltage of the bit lines, and provides positive voltage having high potential to the well after floating the local lines of the memory block not selected. Accordingly, the erase operation may be performed irrespective of the first and second bit line control circuits 150A and 150B.

The operation circuit 120, 130, 140, 160, and 170 selects simultaneously the memory blocks corresponding to the block address signal in the first memory block group 110PA and the second memory block group 110PB in response to the block address signal, and thus, an area by which the operation circuit, especially row decoder occupies may reduce. Since only memory block operates normally by the first and second bit line control circuits 150A and 150B though two memory blocks are selected simultaneously, error may not occur.

An area by which the first and second bit line control circuits 150A and 150B occupy may increase in the chip accordingly as the first or second bit line control circuit 150A or 150B are further included, but size of the chip may be reduced because size of the row decoder decreases more than the area occupied as the result of increase in the first or second bit line control circuit 150A or 150B.

Figure 6:
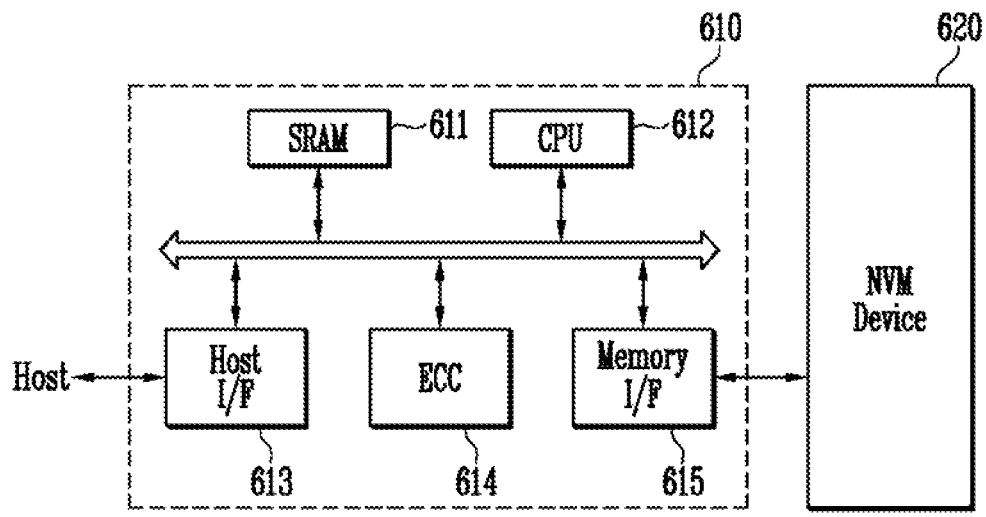
FIG. 6 is a block diagram illustrating schematically a memory system including a semiconductor memory device according to the embodiment of the present invention.

FIG. 6 is a block diagram illustrating schematically a memory system including a semiconductor memory device according to the embodiment of the present invention.

In FIG. 6, the memory system 600 of the present embodiment includes a non-volatile memory device 620 and a memory controller 610.

The non-volatile memory device 620 may be the semiconductor memory device described above. The memory controller 610 controls the non-volatile memory device 620. The memory system 600 may be used as a memory card or a solid state disk (SSD) by combining the non-volatile memory device 620 and the memory controller 610. An SRAM 611 is used as an operation memory of a processing unit 612. A host interface 613 has data exchange protocol of a host accessed to the memory system 600. An error correction block 614 detects and corrects error of data read from the non-volatile memory device 620. A memory interface 614 interfaces with the non-volatile memory device 620 of the embodiment of the present invention. The processing unit 612 performs control operation for data exchange of the memory controller 610.

The memory system 600 may further include a ROM (not shown) for storing code data for interfacing with the host and so on. The non-volatile memory device 620 may be provided as multi-chip package including flash memory chips. The memory system 600 may be provided as highly reliable storage medium having a low error possibility. Specifically, the flash memory device may be included in the SSD actively studied recently. In this case, the memory controller 610 communicates with an external device, e.g. host, through one of various interface protocols such as a universal serial bus (USB), a multi-media card (MMC), a peripheral component interconnection (PCI), a PCI-express (PCI-E), a parallel advanced technology attachment (PATA), a serial ATA (SATA), an small computer system interface (SCSI), an enhanced small device interface (ESDI), an integrated drive electronics (IDE), or the like.

Figure 7:
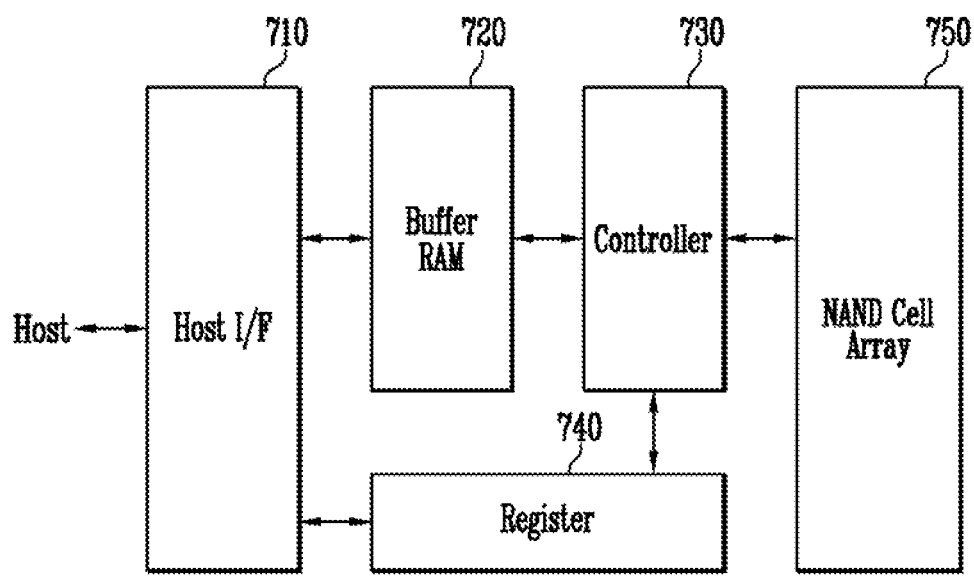
FIG. 7 is a block diagram illustrating schematically a fusion memory device or a fusion memory system for performing a program operation according to the embodiment described above.

FIG. 7 is a block diagram illustrating schematically a fusion memory device or a fusion memory system for performing a program operation according to the embodiment described above. For example, features of the present invention may be applied to an OneNAND flash memory device 700 as a fusion memory device.

The OneNAND flash memory device 700 includes a host interface 710 for exchanging information with a device using different protocol, a buffer RAM 720 for embedding code for driving the memory device or storing temporarily data, a controller 730 for controlling reading, programming and every state in response to a control signal and a command inputted from an outside device a register 740 for storing data such as configuration for defining command, address, system operation environment in the memory device, and a NAND flash cell array 750 having operation circuit including a non-volatile memory cell and a page buffer. A memory array of the NAND flash cell array 750 may be applied with the memory array shown in FIG. 2.

Figure 8:
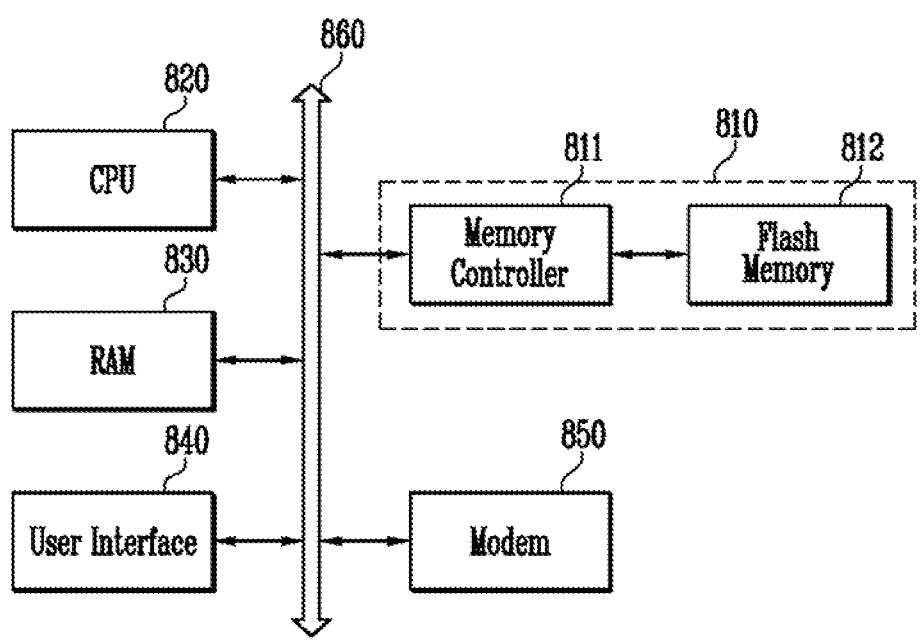
FIG. 8 is a block diagram illustrating schematically a computing system including a semiconductor memory device according to the embodiment of the present invention.

FIG. 8 is a block diagram illustrating schematically a computing system including a semiconductor memory device according to the embodiment of the present invention.

The computing system 800 of the present invention includes a microprocessor 820 coupled electrically to a system bus 860, a RAM 830, an user interface 840, a modem 850 such as a baseband chipset, and a memory system 810. In case that the computing system 800 is a mobile device, a battery (not shown) for supplying an operation voltage of the computing system 800 may be further provided. The computing system 800 of the present invention may further include an application chipset, a camera image processor CIP, a mobile DRAM, etc. The memory system 810 may include an SSD using for example a non-volatile memory for storing data. The memory system 810 may be applied to a fusion flash memory, e.g. OneNAND flash memory.

Although embodiments have been described with reference to a number of illustrative embodiments thereof, it should be understood that numerous other modifications and embodiments may be devised by those, skilled in the art that will fall within the spirit and scope of the principles of this disclosure as defined in the following claims.

What is claimed is:

1. A semiconductor memory device comprising:
   a first memory block group including memory blocks coupled to first sub bit lines;
   a second memory block group including memory blocks coupled to second sub bit lines;
   an operation circuit coupled to main bit lines, and configured to perform an operation for data input/output to/from a memory block selected from the first memory block group or the second memory block group; and
   a bit line control circuit configured to differently control sub bit lines of the selected memory block group and sub bit lines of the unselected memory block groups in response to group select signals for selecting a memory block group including the selected memory block of the first memory block group and the second memory block group and voltages of the main bit lines controlled by the operation circuit,
   wherein the operation circuit controls the voltage levels of the main bit lines according to data in a program operation for storing the data in memory cells included in the selected memory block of the first memory block group.

2. The semiconductor memory device of claim 1, wherein the operation circuit outputs the group select signals using a group address signal or a plane address signal included in an address signal.

3. The semiconductor memory device of claim 1, wherein the bit line control circuit selectively discharges first sub bit lines of the first memory block group and precharges second sub bit lines of the second memory block group based on the voltage levels of the main bit lines and the group select signal when the program operation is performed.

4. The semiconductor memory device of claim 1, wherein the operation circuit differently control voltage levels of even main bit lines and odd main bit lines of the main bit lines according to data in a program operation for storing the data in memory cells included in the selected memory block of the first memory block group.

5. The semiconductor memory device of claim 4, wherein the bit line control circuit selectively discharges first even sub bit lines of the first sub bit lines and precharges first odd sub bit lines of the first sub bit lines based on voltage levels of the even main bit lines and the group select signals, or
   selectively discharges the first odd sub bit lines and precharges the first even sub bit lines according to voltage levels of the odd main bit lines and the group select signals.

6. The semiconductor memory device of claim 5, wherein the bit line control circuit precharges all of second even bit lines and second odd sub bit lines included in the second sub bit lines based on the group select signals.

7. The semiconductor memory device of claim 1, wherein the bit line control circuit precharges the first sub bit lines of the first memory block group and selectively precharges or discharges the second sub bit lines of the second memory block group based on the voltage levels of the main bit lines and the group select signals in a program verifying operation for verifying result of a program operation of memory cells included in the selected memory block of the first memory block group.

8. The semiconductor memory device of claim 7, wherein the bit line control circuit precharges all of even sub bit lines and odd sub bit lines included in the first sub bit lines.

9. The semiconductor memory device of claim 7, wherein the bit line control circuit connects the first sub bit lines to the main bit lines in response to a sensing enable signal so that the operation circuit senses voltage or current of the first sub bit lines after a verifying voltage is supplied to the memory cells by the operation circuit.

10. The semiconductor memory device of claim 1, wherein the bit line control circuit precharges the first sub bit lines of the first memory block group and selectively precharges or discharges the second sub bit lines of the second memory block group based on the voltages of the main bit lines and the group select signals in a read operation of reading data of memory cells included in the selected memory block of the first memory block group.

11. The semiconductor memory device of claim 10, wherein the bit line control circuit precharges all of even sub bit lines and odd sub bit lines included in the first sub bit lines.

12. The semiconductor memory device of claim 10, wherein the bit line control circuit connects the first sub bit lines to the main bit lines in response to a sensing enable signal so that the operation circuit senses voltage or current of the first sub bit lines after a read voltage is supplied to the memory cells by the operation circuit.

13. The semiconductor memory device of claim 1, wherein the operation circuit selects simultaneously a first memory block and a second memory block corresponding to a block address signal from the first memory block group and the second memory block group based on a row address signal including the block address signal.

14. The semiconductor memory device of claim 1, wherein the bit line control circuit includes:
   a first bit line control circuit configured to control the first sub bit lines in response to the voltage levels of the main bit lines and a first group select signal; and
   a second bit line control circuit configured to control the second sub bit lines in response to the voltage levels of the main bit lines and a second group select signal.

15. The semiconductor memory device of claim 14, wherein the first bit line control circuit includes:
   an AND gate, the voltage level of the corresponding main bit line and the first group select signal being inputted to the AND gate;
   an OR gate, the voltage level of the corresponding main bit line, the first group select signal and an output signal of the AND gate being inputted to the OR gate and an output terminal of the OR gate being coupled to the corresponding first sub bit line; and
   a switching element coupled between the corresponding main bit line and the corresponding first sub bit line and configured to operate in response to a sensing enable signal.

16. The semiconductor memory device of claim 14, wherein the second bit line control circuit includes:
   an AND gate, the voltage level of the corresponding main bit line and the second group select signal being inputted to the AND gate;
   an OR gate, the voltage level of the corresponding main bit line, the second group select signal and an output signal of the AND gate being inputted to the OR gate and an output terminal of the OR gate being coupled to the corresponding second sub bit line; and
   a switching element coupled between the corresponding main bit line and the corresponding second sub bit line and configured to operate in response to a sensing enable signal.

17. The semiconductor memory device of claim 14, wherein the first bit line control circuit includes:
   a first AND gate, a voltage level of an even main bit line of the main bit lines and the first group select signal being inputted to the first AND gate;
   a first OR gate, a voltage level of the corresponding even main bit line, the first group select signal and an output signal of the first AND gate being inputted to the first OR gate and an output terminal of the first OR gate being coupled to a first even sub bit line of the first sub bit lines;
   a first switching element coupled between the corresponding even main bit line and the first even sub bit line and configured to operate in response to a first even sensing enable signal;
   a second AND gate, a voltage level of an odd main bit line of the main bit lines and the first group select signal being inputted to the second AND gate;
   a second OR gate, a voltage level of the corresponding odd main bit line, the first group select signal and an output signal of the second AND gate being inputted to the second OR gate and an output terminal of the second OR gate being coupled to a first odd sub bit line of the first sub bit lines; and
   a second switching element coupled between the corresponding odd main bit line and the first odd sub bit line and configured to operate in response to a first odd sensing enable signal.

18. The semiconductor memory device of claim 14, wherein the second bit line control circuit includes:
   a first AND gate, a voltage level of an even main bit line of the main bit lines and the second group select signal being inputted to the first AND gate;
   a first OR gate, a voltage level of the corresponding even main bit line, the second group select signal and an output signal of the first AND gate being inputted to the first OR gate and an output terminal of the first OR gate being coupled to a second even sub bit line of the second sub bit lines;
   a first switching element coupled between the corresponding even main bit line and the second even sub bit line and configured to operate in response to a second even sensing enable signal;
   a second AND gate, a voltage level of an odd main bit line of the main bit lines and the second group select signal being inputted to the second AND gate;
   a second OR gate, a voltage level of the corresponding odd main bit line, the second group select signal and an output signal of the second AND gate being inputted to the second OR gate and an output terminal of the second OR gate being coupled to a second odd sub bit line of the second sub bit lines; and
   a second switching element coupled between the corresponding odd main bit line and the second odd sub bit line and configured to operate in response to a second odd sensing enable signal.

19. The semiconductor memory device of claim 1, wherein the main bit lines are disposed on different layer from the first sub bit lines and the second sub bit lines.

20. The semiconductor memory device of claim 1, wherein the operation circuit selects simultaneously memory blocks corresponding to a block address signal in the first memory block group and the second memory block group in response to the block address signal.

21. The semiconductor memory device of claim 1, wherein the operation circuit includes:
   a voltage generation circuit configured to generate operation voltages needed for the operation for the data input/output;

voltage transferring sections configured to deliver the operation voltages, each of memory blocks of the first memory block group and the second memory block group being provided the corresponding voltage transferring section;

a row decoder configured to generate a block select signal for activating simultaneously one of the voltage transferring sections provided in the first memory block group and one of the voltage transferring sections provided in the second memory block group in response to a block address signal; and a page buffer group configured to control or sense the voltage levels of the main bit lines for the operation for the data input/output.

* * * * *